United States Patent [19]
Chen

[11] Patent Number: 5,722,050
[45] Date of Patent: Feb. 24, 1998

[54] TRANSMITTER-RECEIVER SYSTEM FOR USE IN AN AUDIO EQUIPMENT

[76] Inventor: Jinsaun Chen, 2F1., No. 8&10, Lane 337, Yung Ho Road, Chung Ho City, Taipei Hsien, Taiwan

[21] Appl. No.: 633,644

[22] Filed: Apr. 17, 1996

[51] Int. Cl.$^6$ ............................................. H04B 7/00
[52] U.S. Cl. ........................... 455/66; 455/42; 455/344
[58] Field of Search ............................... 38/3, 4, 14, 25; 455/42, 66, 344, 350, 351, 91, 110, 118, 500, 517, 93, 129, 205

[56] References Cited

U.S. PATENT DOCUMENTS 5,553,312  9/1996  Gattey et al. ........................... 455/66

FOREIGN PATENT DOCUMENTS 4-10877   1/1992   Japan ........................... H04N 5/60
2121649  12/1983   United Kingdom ................. 455/42

*Primary Examiner*—Nguyen Vo
*Attorney, Agent, or Firm*—Donald C. Casey, Esq.

[57] ABSTRACT

A transmitter-receiver system including a transmitter unit installed in an audio equipment, and a receiver unit installed in an earphone, wherein the transmitter unit includes an automatic electric level regulator to regulate the electric level of the output signal of audio equipment to a predetermined range, a power control circuit controlled by the output signal of the audio equipment to provide the necessary working voltage, and an inductance antenna to transmit output signal from the audio equipment to the receiver unit; the receiver unit is of low working voltage design, including an automatic 24-time frequency divider circuit to effectively discriminate left and right sound tracks, and an auto-shut off circuit to automatically cut off power supply when the audio equipment does no work; the transmitter unit and the receiver unit further use a respective dual oscillation frequency regulating circuit consisting of an oscillating transistor, a dielectric resonator, and two variable resistors for regulating the range of the frequency.

1 Claim, 2 Drawing Sheets

TRANSMITTER-RECEIVER SYSTEM FOR USE IN AN AUDIO EQUIPMENT

BACKGROUND OF THE INVENTION

The present invention relates to a transmitter-receiver system for use in an audio equipment which comprises a transmitter unit installed in the audio equipment to transmit its output signal, and a receiver unit installed in an earphone to receive transmitted signal from the transmitter unit.

In order not to interfere with others while listening the music of an audio equipment, an earphone shall be used. However, when an earphone is used and connected to the output terminal of the audio equipment, the limitation of the length of the electric wire of the earphone, the movement of the user is confined to a limited area. Furthermore, when an audio equipment is installed, the electric wires between the amplifier and the speakers may be disorderly exposed to the outside. If to keep the electric wires from sight, the installation cost of the audio equipment will be high.

SUMMARY OF THE INVENTION

The present invention has been accomplished to provide a transmitter-receiver system which eliminates the aforesaid problems. It is one object of the present invention to provide a transmitter-receiver system which can be installed in the amplifier and speakers of an audio equipment so that the sound signal of the amplifier can be transmitted to the speakers for out put wirelessly. It is another object of the present invention to provide a transmitter-receiver system which can be installed in an audio equipment and an earphone so that the user can listen to the music of the audio equipment without interfering other persons. It is still another object of the present invention to provide a transmitter-receiver system which eliminates the use of a complidated matching device by using an inductance type transmitting antenna, which reduces the floating of frequency. It is still another object of the present invention to provide a transmitter-receiver system which consumes low voltage. It is still another object of the present invention to provide a transmitter-receiver unit which automatically cuts of battery power supply when the audio equipment does no work. It is still another object of the present invention to provide a transmitter-receiver unit which adopts a dual oscillation frequency regulating circuit for the transmitter unit as well as the receiver unit so that the range of the frequency can be broadly adjusted without being limited by the installation of a SAW as did in conventional methods, in which the output of the first intermediate frequency can be within the range from 10.7 MH to 100 MH; the second frequency mixing and the second local oscillation may be eliminated when desired. It is still another object of the present invention which allows the user (consumer) to charge the frequency of the first local oscillation through VR1 without changing the frequency of the second local oscillation.

According to the preferred embodiment of the present invention, the transmitter unit comprises an automatic electric level regulator to regulate the electric level of the output signal of audio equipment to a predetermined range, a power control circuit controlled by the output signal of the audio equipment to provide the necessary working voltage, and an inductance antenna to transmit output signal from the audio equipment to the receiver unit. The receiver unit comprises an automatic 24-time frequency divider circuit to effectively discriminate left and right sound tracks, and an auto-shut off circuit to automatically cut off power supply when the audio equipment does work. Furthermore, the transmitter unit and the receiver unit further use a respective dual oscillation frequency regulating circuit consisting of an oscillating transistor, a dielectric resonator, and two variable resistors for regulating the range of the frequency.

DETAILED DESCRIPTION OF THE PREFERRED EMBODIMENT

Figure 1:
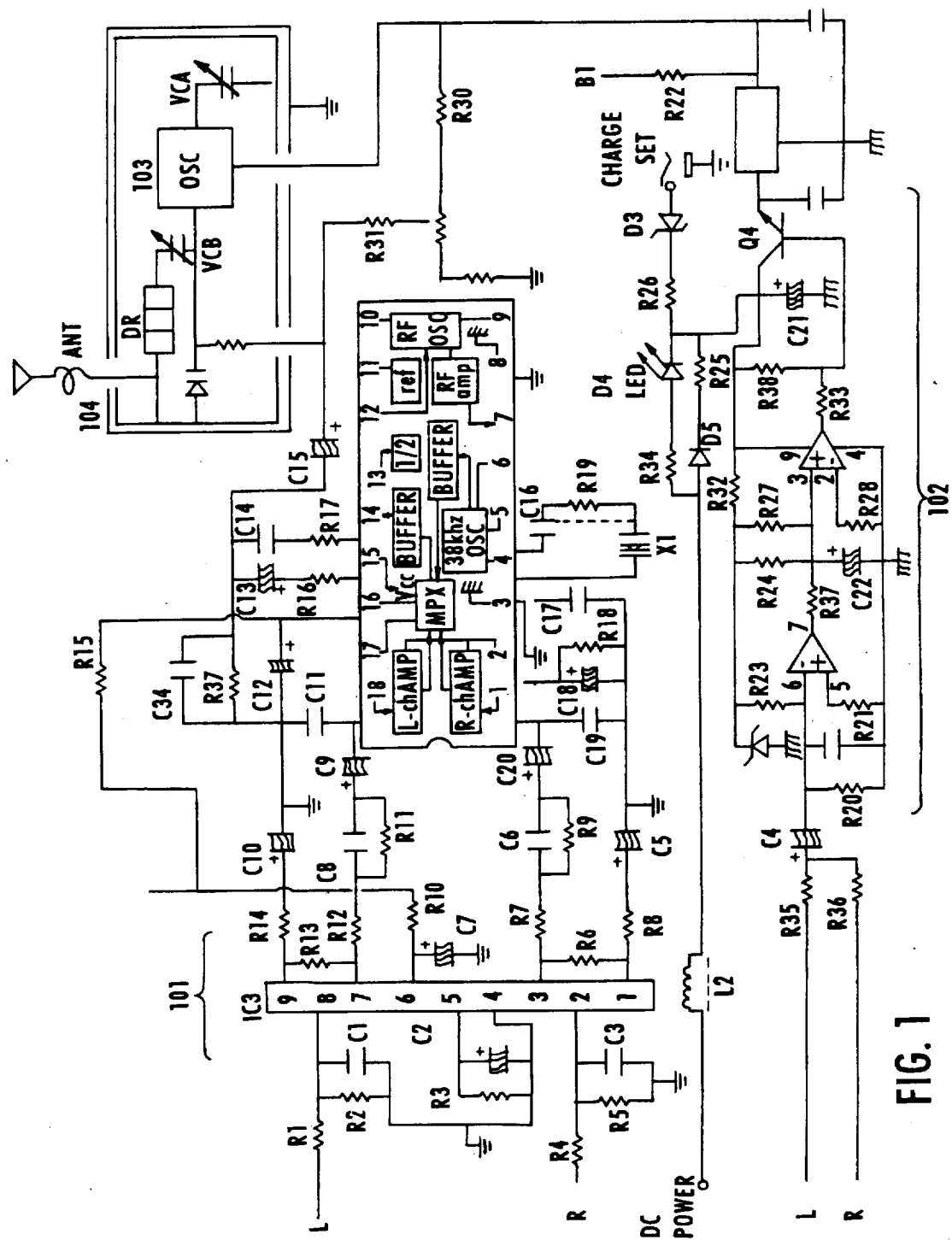
FIG. 1 is a circuit diagram of the transmitter unit of the transmitter-receiver system of the preferred embodiment of the present invention.
Figure 2:
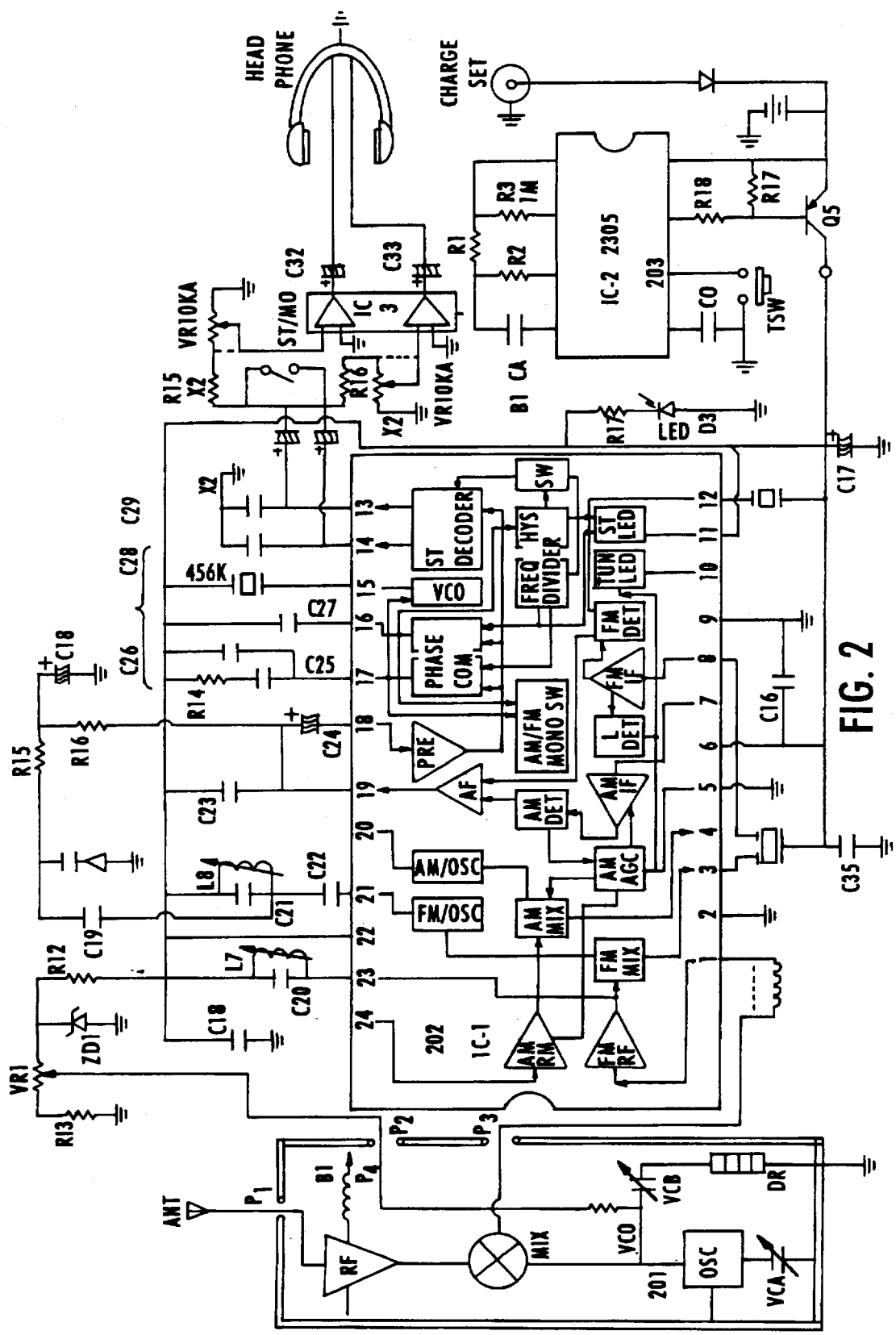
FIG. 2 is a circuit diagram of the receiver unit of the transmitter-receiver system of the preferred embodiment of the present invention.
Figure 2:
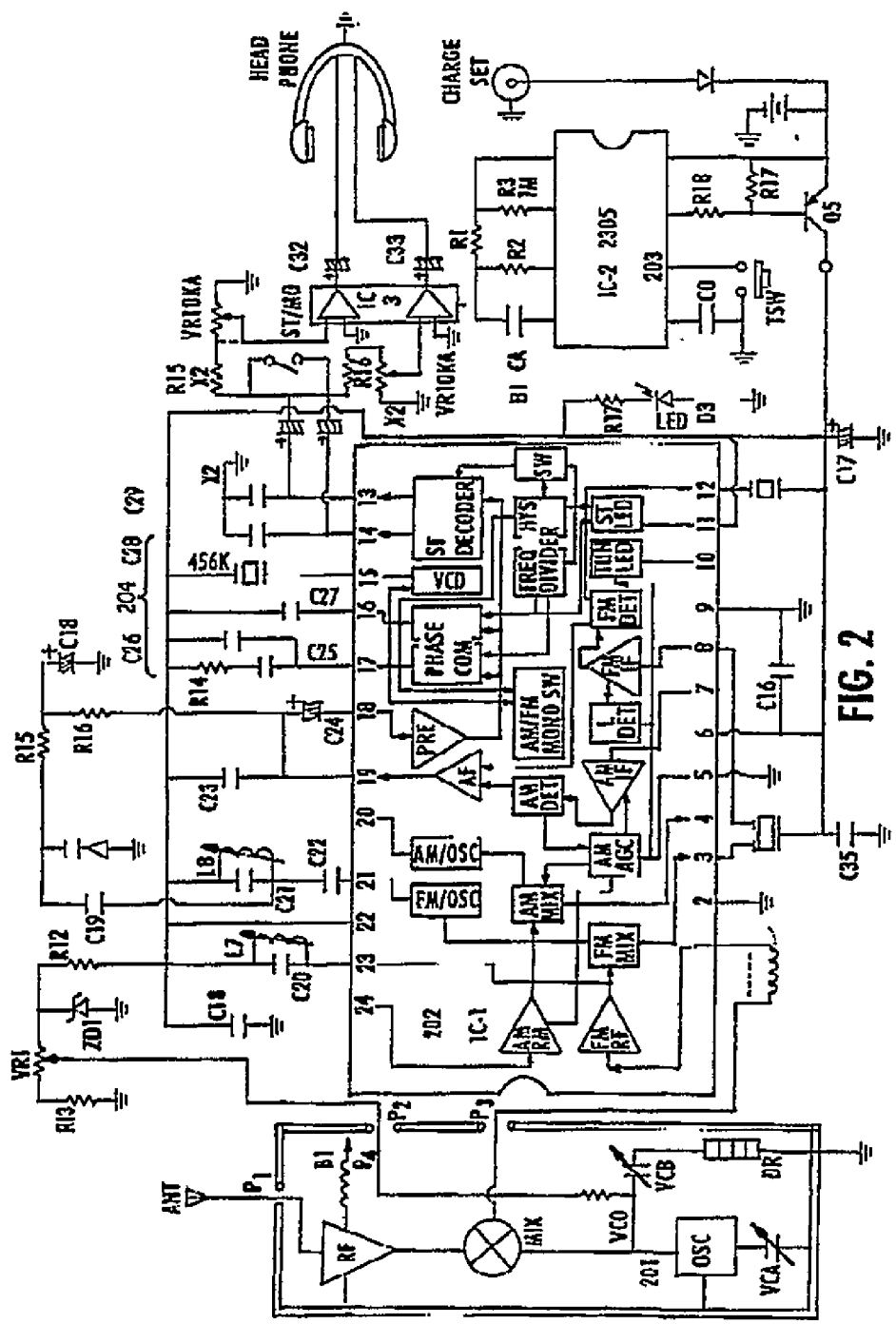

A transmitter-receiver system in accordance with the present invention is comprised of a transmitter unit installed in the mainframe of an audio equipment, and a receiver unit installed in an earphone. FIG. 1 shows the circuit of the transmitter unit. FIG. 2 shows the circuit of the receiver unit.

Referring to FIG. 1, the automatic electrical level regulator, referenced by 101, is comprised of an electrical level regulating integrated circuit IC3. When the output signal of the mainframe of the audio equipment is received, it is transmitted to the input terminal of the electrical level regulator IC3, which regulates the electrical level of the signal to a standard level and then sends the regulated signal to a posterior signal processing circuit. As the signal processing circuit is not within the scope of the present invention, it is not described in detail. The power control circuit, referenced by 102, is comprised of a comparator and a transistor. When the comparator of the power control circuit 102 receives a signal, the comparator of the power control circuit 102 immediately turns on the transistor, permitting external power supply to be connected to the transmitter unit, to provide it with the necessary working voltage. When the comparator of the power control circuit 102 receives no signal, it immediately turns off the transistor. The dual oscillation frequency regulating circuit, referenced by 103, is comprised of an oscillating transistor OSC, a dielectric resonator DR, and two variable resistors VCA, VCB. The input terminal of the oscillation frequency regulating circuit 103 is connected to the output terminal of the aforesaid signal processing circuit, and the output terminal thereof is connected to the inductance antenna, referenced by 104. The inductance antenna 104 itself is a matching device, therefore no any external matching device is needed.

Referring to FIG. 2, the receiver unit comprises an oscillation frequency regulating circuit (see the left side of FIG. 2). The structure of the input terminal of the oscillation frequency regulating circuit is identical to that of the transmitter unit. The input terminal of the oscillation frequency regulating circuit is connected to the receiving antenna, and the output terminal thereof is connected to the signal processing circuit of the receiver unit. The signal processing circuit of the receiver unit is comprised of an integrated circuit IC-1. The 24-time frequency divider circuit, referenced by 204, is comprised of a resistor R14, capacitors C25, C26, C27, C28, C29, and an oscillator, and connected to the signal processing circuit IC-1 to divide the frequency of the output signal of the signal processing circuit IC-1 by 24, so as to provide a 19 KHz three-dimensional demodulated signal of better left, right sound track discrimination. When the output signal of the signal processing circuit is amplified, it is provided to the speaker of earphone. The auto-shut off circuit is comprised of an integrated circuit IC-2 and a transistor Q5. The transistor Q5 is controlled by the integrated circuit IC-2 to turned on/off external power supply or battery power supply. The integrated circuit IC-2 can automatically cut off power supply after a predetermined length of time. The working voltage of the receiver unit is designed at a low level about 2.1–3.5V so that battery power consumption can be minimized.

It is to be understood that the drawings are designed for purposes of illustration only, and are not intended as a definition of the limits and scope of the invention disclosed.

What the invention claimed is:

1. A transmitter-receiver system comprising a transmitter unit installed in an audio equipment, and a receiver unit installed in an earphone, wherein:

said transmitter unit comprises:

an automatic electric level regulator, said automatic electric level regulator comprised of an electrical regulating IC, having an input terminal connected to the output terminal of said audio equipment to regulate the electric level of the output signal of said audio equipment to a predetermined range, and an output terminal;

a signal processing circuit having an input terminal connected to the output terminal of said automatic electric level regulator, and an output terminal;

a dual oscillation frequency regulating circuit, said dual oscillation frequency regulating circuit comprised of an oscillating transistor, a dielectric resonator, a first variable resistor, and a second variable resistor, having an input terminal connected to the output terminal of said signal processing circuit, and an output terminal, a first intermediate frequency output being within 10.7 MH to 100 MH and adjusted by said first variable resistor;

an inductance antenna connected to the output terminal of said dual oscillation frequency regulating circuit, said inductance antenna being a matching device; and a power control circuit controlled by the output signal of said audio equipment to provide the necessary working voltage to said transmitter unit, said power control circuit comprised of a comparator and a transistor, said comparator turning on said transistor when receiving a signal from said audio equipment, permitting external power supply to be connected to said transmitter unit;

said receiver unit comprises:

a receiving antenna to receive radio signal transmitted from said inductance antenna of said transmitter unit;

a dual oscillation frequency regulating circuit, the dual oscillation frequency regulating circuit of said receiver unit comprised of an oscillating transistor a dielectric resonator, and two variable resistors, having an input terminal connected to the output terminal of said receiving antenna, and an output terminal;

a signal processing circuit connected to said oscillation frequency regulating circuit of said receiver unit to process received signal and to provide processed signal to said earphone;

an automatic 24-time frequency divider circuit, said automatic 24-time frequency divider circuit comprised of a resistor and an oscillator and connected to an IC of the signal processing circuit of said receiver unit to divide the frequency of received signal by 24, so as to provide a 19 KHz three-dimensional demodulated signal; and an auto-shut off circuit, said auto-shut off circuit comprised of an IC and a transistor, said transistor of said auto-shut off circuit being controlled by the IC of said auto- off circuit to turned on/off external power supply.

* * * * *

UNITED STATES PATENT AND TRADEMARK OFFICE
CERTIFICATE OF CORRECTION

PATENT NO. : 5,722,050
APPLICATION NO. : 08/633644
DATED : February 24, 1998
INVENTOR(S) : Jinsaun Chen It is certified that error appears in the above-identified patent and that said Letters Patent is hereby corrected as shown below:

In the drawings delete fig. 2, and substitute the attached fig 2.

Column 1, line 29, after "for" delete "out put" and insert --output--.
Column 1, line 36, delete "complidated" and insert --complicated--.
Column 1, line 42, after "does" delete "no" and insert --not--.
Column 1, line 50, after "from" delete "10.7 MH to 100 MH" and insert -- 10.7MHz to 100MHz --.
Column 2, line 1, delete "no" and insert --not--.
Column 3, line 33, after "within" delete "10.7 MH to 100 MH" and insert -- 10.7MHz to 100MHz--

Signed and Sealed this

Twenty-third Day of October, 2007

JON W. DUDAS
*Director of the United States Patent and Trademark Office*